US008665652B2

(12) United States Patent
Huang et al.

(10) Patent No.: US 8,665,652 B2
(45) Date of Patent: Mar. 4, 2014

(54) METHOD FOR ERASING MEMORY ARRAY

(75) Inventors: Jyun-Siang Huang, Hsinchu (TW); Wen-Jer Tsai, Hsinchu (TW); Ping-Hung Tsai, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 219 days.

(21) Appl. No.: 13/168,554

(22) Filed: Jun. 24, 2011

(65) Prior Publication Data

US 2012/0327721 A1 Dec. 27, 2012

(51) Int. Cl.
*G11C 11/34* (2006.01)

(52) U.S. Cl.
USPC ............ 365/185.29; 365/185.01; 365/185.03; 365/185.05; 365/185.11; 365/185.12; 365/185.14; 365/185.17; 365/185.18; 365/185.23; 365/185.27

(58) Field of Classification Search
USPC ............ 365/185.01, 185.03, 185.05, 185.11, 365/185.12, 185.14, 185.17, 185.18, 365/185.23, 185.27, 185.29
See application file for complete search history.

(56) References Cited

U.S. PATENT DOCUMENTS

| 2010/0002513 A1 | 1/2010 | Lutze et al. | |
|---|---|---|---|
| 2011/0103155 A1* | 5/2011 | Chang et al. | 365/185.28 |
| 2012/0250413 A1* | 10/2012 | Kim | 365/185.12 |

* cited by examiner

*Primary Examiner* — Fernando Hidalgo
(74) *Attorney, Agent, or Firm* — J.C. Patents

(57) ABSTRACT

A method for erasing a memory array is provided. The memory array comprises a plurality of memory cell strings, and each of the memory cell strings comprises a plurality of memory cells connected to a plurality of word lines. The method for erasing the memory array includes the following steps. A first voltage is applied to a substrate of the memory array. A second voltage is applied to a word line of a selected memory cell, and a plurality of passing voltages are applied to other word lines. And, a third voltage and a fourth voltage are respectively applied to a first source/drain region and a second source/drain region of the selected memory cell, so that a band to band (BTB) hot hole injecting method is induced to erase the specific memory cell, wherein the third voltage is not equal to the fourth voltage.

19 Claims, 14 Drawing Sheets

METHOD FOR ERASING MEMORY ARRAY

BACKGROUND OF THE INVENTION

1. Field of the Invention

The invention generally relates to a method for operating a memory array, and more particularly, to a method for erasing a selected memory cell in a memory array.

2. Description of Related Art

Semiconductor memories can be categorized into volatile memories and non-volatile memories. Data stored in a non-volatile memory (for example, a flash memory) can be retained even when no power is supplied. Flash memory has been developed and applied for high density data storage, such as memory cards in digital cameras, memories in MP3 players, and universal serial bus (USB) memory devices. Besides, flash memory has also been applied as storage devices of personal computers (PCs), such as solid state drive (SSD). Thereby, flash memory is a very promising product in the market of memories.

FIG. 1 is a diagram of a NAND memory array 100. Referring to FIG. 1, the NAND memory array 100 includes a plurality of memory cell strings (for example, memory cell strings 150_1-150_2). Each of the memory cell strings has a select transistor, a plurality of memory cells, and a ground transistor that are connected with each other in series. Each of the memory cell strings is connected to a corresponding word line. The gates of the select transistors and the ground transistors are respectively coupled to a string select line SSL and a ground select line GSL so that the voltages on two ends of the memory cell strings can be applied respectively through the string select line SSL and the ground select line GSL. For example, the memory cell string 150_1 includes a select transistor SW11, memory cells 101-132, and a ground transistor SW12, wherein the memory cells 101-132 are respectively and coupled to word lines WL1-WL32. One ends of the select transistors SW11 and SW21 are respectively and coupled to bit lines BL1 and BL2, and the other ends of the ground transistors SW12 and SW22 are both applied to a ground voltage GND.

Conventionally, the NAND memory array 100 is usually erased in unit of memory block. For example, the memory cell strings 150_1-150_2 are considered a same memory block, the substrates of all the memory cells (for example, the memory cells within the dotted frame 160) in the memory block are applied to a power supply of 20V (i.e., the voltage Vs on the substrates is made to be equal to 20V), and the bit lines BL1-BLN are floated. Next, the gates of the select transistor SW11 and the ground transistor SW12 are applied to the supply voltage Vcc or floated through the string select line SSL and the ground select line GSL, so that both ends of the memory cell strings 150_1-150_2 are floated. After that, a ground voltage GND is supplied to the word lines WL1-WL32 so that a high-voltage drop is produced between the gate and substrate of each memory cell. Accordingly, electrons in the floating gate of each memory cell can pass through the oxide layer of the memory cell and enter the substrate, so that the memory cell is erased. Such an erasing technique is referred to as the Fowler-Nordheim (FN) tunnelling technique.

Generally speaking, existing memory arrays are usually erased through the FN tunneling technique described above. However, because the FN tunnelling technique requires to apply a larger voltage drop (for example, a voltage drop greater than 20V) to produce a large enough vertical electric field, a high operating voltage is needed. In addition, only a limited number of programming-erasing (P/E) cycles can be performed on a flash memory. For example, an industrial flash memory can be programmed-erased for 100,000 times. However, the conventional FN tunnelling technique can only erase a memory array in unit of an entire memory block. Thus, it is impossible to erase a single memory cell through the FN tunnelling technique. In other words, random data reading and writing operations but no random erasing operation can be performed on any selected memory cell in a memory array.

Thereby, how to erase a selected memory cell and, at the same time, reduce the operating voltage has become a major subject regarding the erasing of flash memory.

SUMMARY OF THE INVENTION

Accordingly, the invention is directed to a method for erasing a memory array, wherein a band to band (BTB) hot hole erasing injection method is induced on a selected memory cell through the self boosting or directly voltage applying of memory cells, and the operating voltage required by the erasing operation is lowered.

The invention provides a method for erasing a memory array. the memory array comprises a plurality of memory cell strings, each of the memory cell strings comprises a plurality of memory cells connected to a plurality of word lines. The present method for erasing the memory array includes following steps. A first voltage is applied to a substrate of the memory array. A second voltage is applied to a word line of a selected memory cell, and a plurality of passing voltages are applied to the other word lines. And, a third voltage and a fourth voltage are respectively applied to a first source/drain region and a second source/drain region of the selected memory cell, so that a band to band (BTB) hot hole injecting method is induced to erase the specific memory cell, wherein the third voltage is not equal to the fourth voltage.

According to an embodiment of the invention, each of the memory cell strings further includes a first transistor (e.g., a select transistor) and a second transistor (e.g., a ground transistor), and the memory array erasing method further comprises the following step. One of the first transistor and the second transistor connected to the selected memory cell is turned on, or the first transistor and the second transistor connected to the selected memory cell are turned on at the same time.

According to an embodiment of the invention, the memory array erasing method further comprises the following steps. The first transistor connected to the selected memory cell is turned on, so as to apply the third voltage to the first source/drain region of the selected memory cell. And, the second transistor connected to the selected memory cell is turned off, so that a channel of the memory cells connected to the second source/drain region of the selected memory cell self boosts to the fourth voltage.

According to an embodiment of the invention, the memory array erasing method further comprises the following step. A fifth voltage and a sixth voltage are respectively applied to a first source/drain region and a second source/drain region of a non-selected memory cell string connected the word line, so as to inhibit the non-selected memory cell been erased.

According to an embodiment of the invention, the memory array erasing method further comprises the following step. The first transistor and the second transistor of the memory cell string connected to the non-selected memory cell are turned off at the same time, so that a channel of the memory cells connected to the first source/drain region of the selected memory cell self boosts to the fifth voltage, and a channel of the memory cells connected to the second source/drain region of the selected memory cell self boosts to the sixth voltage.

According to an embodiment of the invention, the memory array erasing method further comprises the following step. The first transistor and the second transistor of the memory cell string connected to the non-selected memory cell are turned on at the same time, so as to apply the fifth voltage and the sixth voltage to the first source/drain region and the second source/drain region of the non-selected memory cell respectively.

According to an embodiment of the invention, the memory array erasing method further comprises the following step. The first transistor of the memory cell string connected to the non-selected memory cell is turned off, so that a channel of the memory cells connected to the first source/drain region of the non-selected memory cell self boosts to the fifth voltage. And, the second transistor of the memory cell string connected to the non-selected memory cell is turned on, so as to apply the sixth voltage to the second source/drain region of the non-selected memory cell. Besides, according to an embodiment of the invention, the second voltage is lower than 0.

As described above, in the invention, a BTB hot hole erasing injection operation is induced on a selected memory cell through the self boosting or directly voltage applying of memory cells, so that the selected memory cell in a specific memory cell string can be erased without affecting the other memory cells. In addition, because the voltage drop required by the BTB hot hole erasing operation is lower than the vertical electric field required by the Fowler-Nordheim (FN) tunnelling technique, the operating voltage required by the erasing operation is greatly lowered.

These and other exemplary embodiments, features, aspects, and advantages of the invention will be described and become more apparent from the detailed description of exemplary embodiments when read in conjunction with accompanying drawings.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
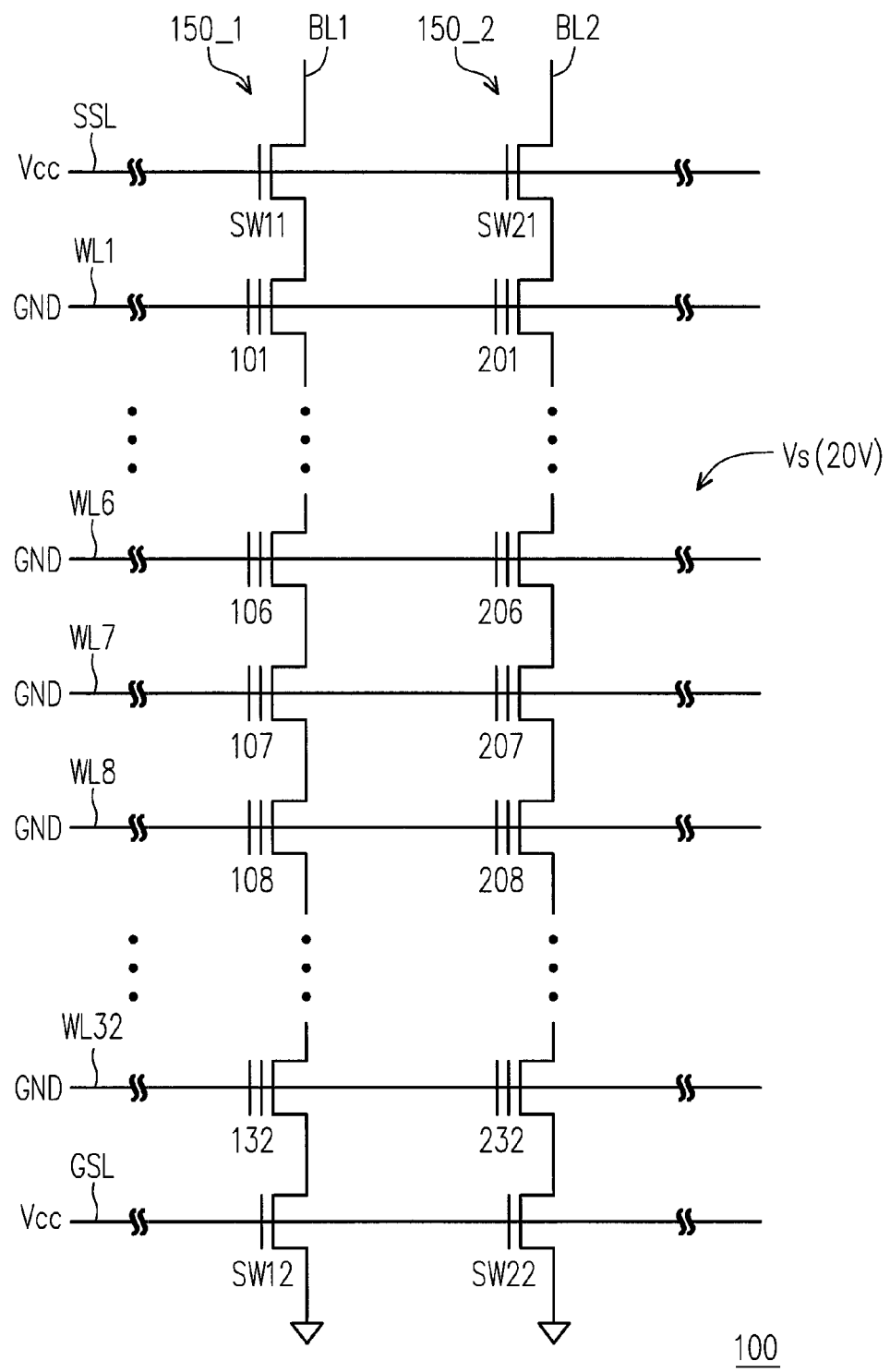
FIG. 1 is a diagram of a NAND memory array.

Reference will now be made in detail to the present preferred embodiments of the invention, examples of which are illustrated in the accompanying drawings. Wherever possible, the same reference numbers are used in the drawings and the description to refer to the same or like parts.

Figure 2:
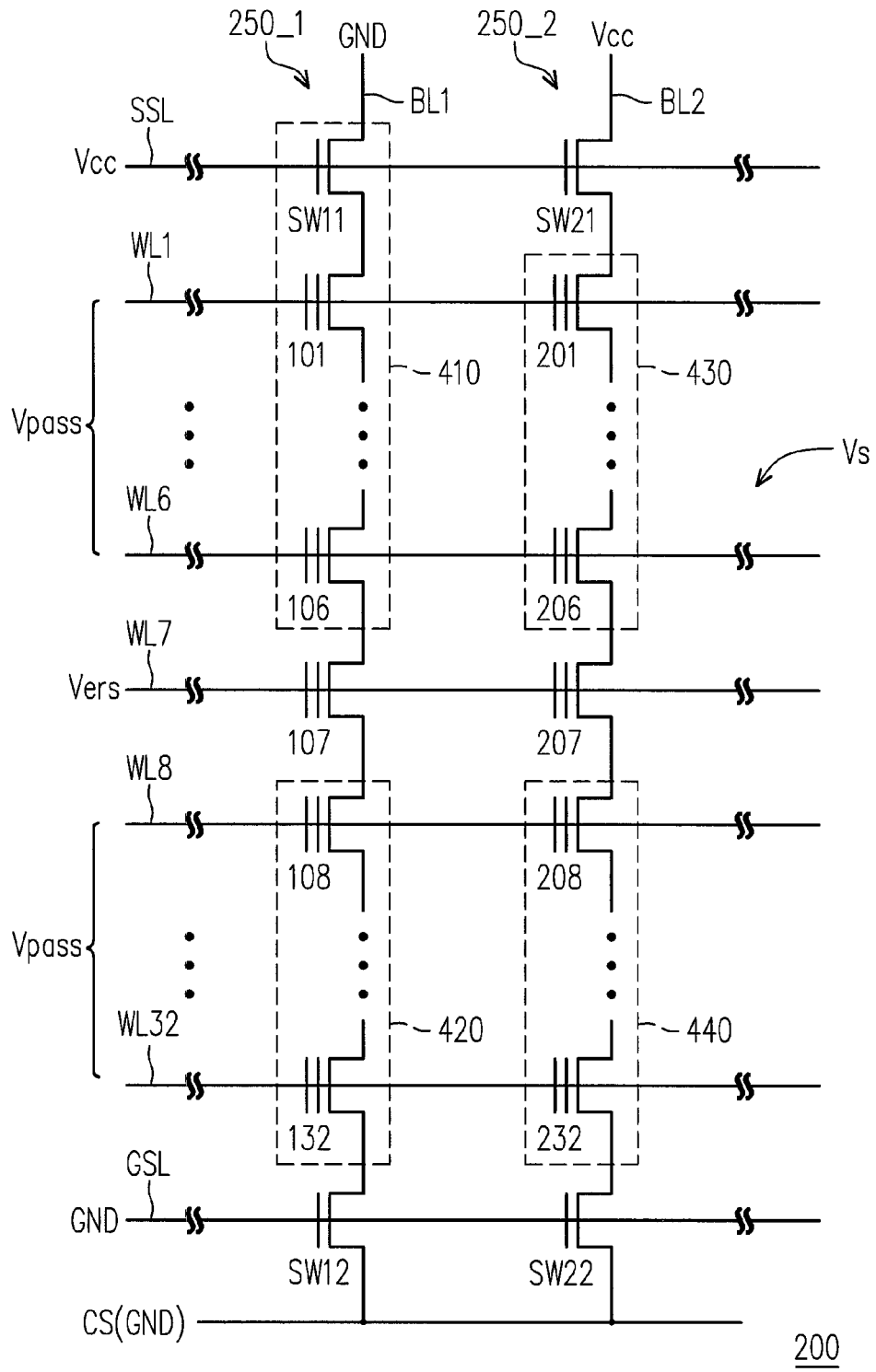
FIG. 2 is a diagram of a memory array according to a first embodiment of the invention.

FIG. 2 is a diagram of a memory array 200 according to a first embodiment of the invention. Referring to FIG. 2, the memory array 200 includes M memory cell strings 250_1-250_M, and each of the memory cell strings includes N memory cells respectively connected to the N word lines WL1-WLN, wherein M and N are both positive integers.

Each memory cell string further includes a first transistor (e.g., a select transistor) and a second transistor (e.g., a ground transistor) connected with the N memory cells in series. Drains of the select transistors are respectively and coupled to corresponding bit lines, and sources of the ground transistors are all coupled to a common source CS. The gates of the select transistors (for example, transistors SW11 and SW21) and the ground transistors (for example, transistors SW12 and SW22) are respectively coupled to a string select line SSL and a ground select line GSL so that the turn-on state at two ends of the memory cell strings can be adjusted through the string select line SSL and the ground select line GSL. For the convenience of description, in the present embodiment, N is assumed to be 32, and two memory cell strings 250_1-250_2 are taken as examples. However, these assumptions are not intended to limit the scope of the invention.

For example, the memory cell string 250_1 includes the select transistor SW11, memory cells 101-132, and the ground transistor SW12 that are connected with each other in series, and the gates of the memory cells 101-132 are respectively and coupled to the word lines WL1-WL32. In the present embodiment, one terminals of the select transistors SW11 and SW21 are respectively and coupled to the bit lines BL1 and BL2, and another terminals of the ground transistors SW12 and SW22 are both coupled to the common source CS.

In other embodiments, the word lines WL1-WLN, the string select line SSL, the ground select line GSL, and the common source CS are controlled by a row decoder (not shown), and the bit lines BL1-BLM are controlled by a page buffer (not shown), so as to implement the method for erasing the memory array 200 according to an embodiment of the invention. However, the invention is not limited thereto.

In order to erase a single memory cell in a specific memory cell string of the memory array 200 and inhibit the other memory cells from the erasing operation, a memory array erasing method is provided in an embodiment of the invention, wherein a band to band (BTB) hot hole injection method is induced on a single memory cell in a specific memory cell string through the self boosting and directly voltage applying of memory cells so that the single memory cell can be erased. The reason of replacing the conventional Fowler-Nordheim (FN) tunnelling technique by using the BTB hot hole tunnelling effect is that the voltage drop required by the BTB hot hole tunnelling effect is about 8V to 10V, while the voltage drop required by the FN tunnelling technique is about 20V. Thus, the operating voltage can be greatly lowered by erasing a memory array through the BTB hot hole tunnelling effect.

Figure 3:
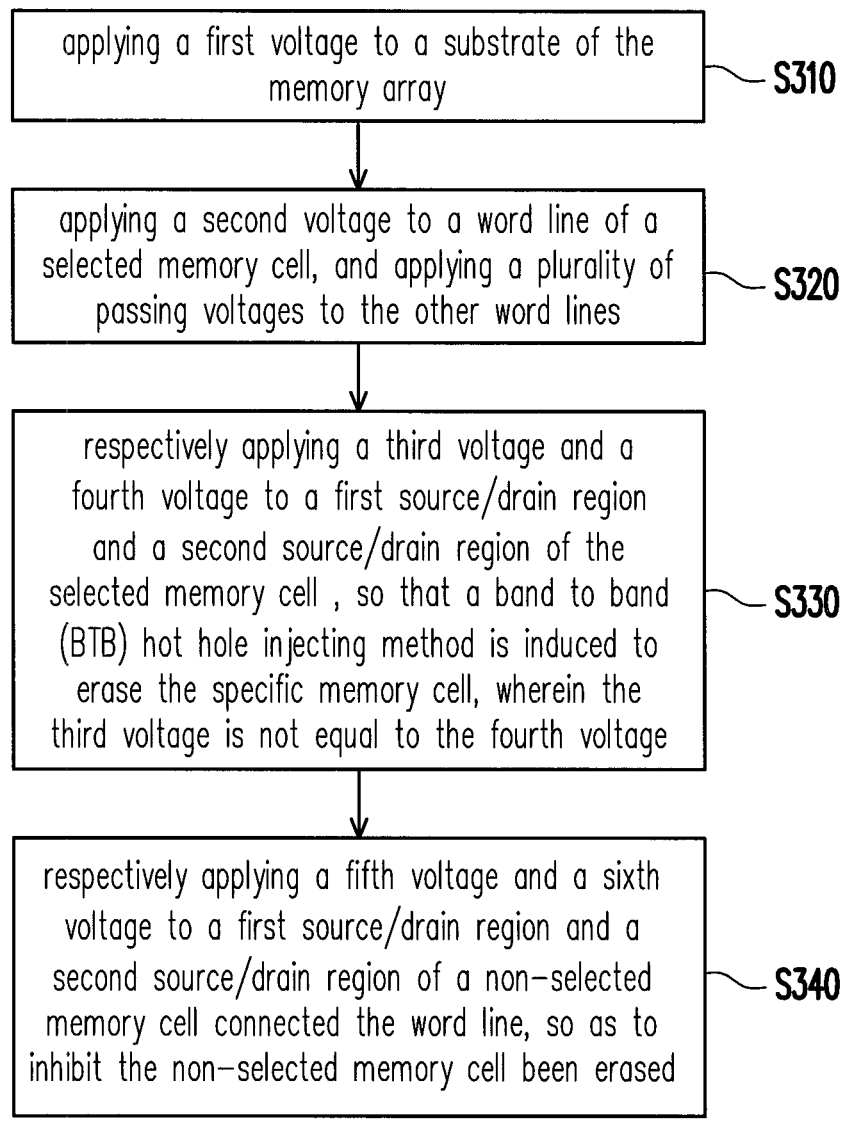
FIG. 3 is a flowchart of a method for erasing a memory array according to an embodiment of the invention.

Below, erasing operations performed in different situations will be described with reference to FIG. 3 and four embodiments of the invention, so as to allow those having ordinary knowledge in the art to better understand the spirit of the invention. FIG. 3 is a flowchart of a method for erasing a memory array according to an embodiment of the invention. In the first and the second embodiment, a BTB hot hole erasing operation is mainly induced on a selected memory cell through the self boosting of memory cells, while in the third and the fourth embodiment, BTB tunnelling hot hole injection is mainly induced on a single memory cell in a specific memory cell string through the directly voltage applying of memory cells. Those skilled in the art can appropriately adjust related voltage levels and operation flows according to the embodiment described above in order to achieve the effect described in embodiments of the invention.

In order to describe the first to the fourth embodiment conveniently, herein it is assumed that the ith memory cell in the memory cell string 250_1 is to be erased and i is set by 7, wherein i is a positive integer not greater than N. Namely, it is assumed that a selected memory cell for erased is considered a 7th memory cell 107 of the memory cell string 250_1, and one of the non-selected memory cells for inhibited to been erased is considered a 7th memory cell 207 of the memory cell string 250_2 for taken as an example. Such that, the memory cell string 250_1 is considered a specific memory cell string, while the other memory cell strings (for example, the memory cell string 250_2) are considered inhibit memory cell strings.

First Embodiment

Figure 4A:
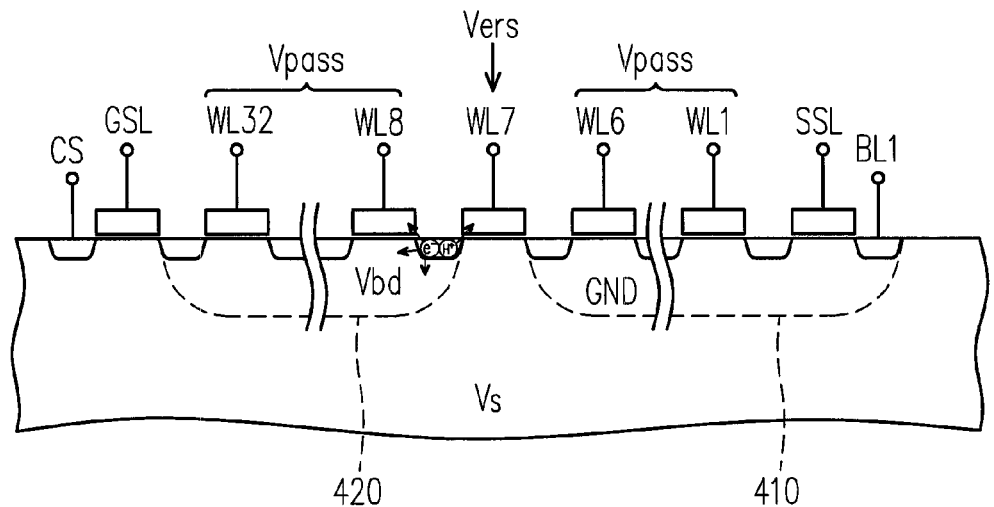
FIG. 4A is a cross-sectional view of a specific memory cell string in FIG. 2.
Figure 4B:
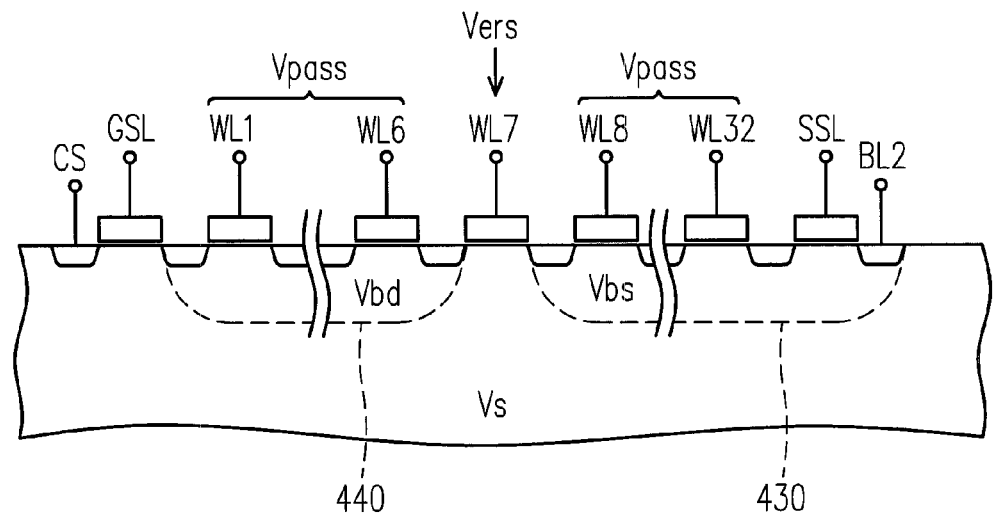
FIG. 4B is a cross-sectional view of a inhibit memory cell string in FIG. 2.

FIG. 4A is a cross-sectional view of the specific memory cell string 250_1 in FIG. 2. FIG. 4B is a cross-sectional view of the inhibit memory cell string 250_2 in FIG. 2. Below, the erasing method in FIG. 3 will be performed on the memory array 200 illustrated in FIG. 2, and the first embodiment will be described with reference to FIG. 4A and FIG. 4B.

First, in step S310, the substrate of the memory array 200 is applied to the ground voltage GND. In the present embodiment, the ground voltage GND is 0V. Thus, in step S310, a substrate voltage Vs of 0V is supplied to the memory array 200. In step S320, a second voltage is applied to the 7$^{th}$ word line WL7, and a plurality of passing voltages Vpass are respectively applied to the other word lines. In the present embodiment, the second voltage is a negative erasing voltage Vers, and the negative erasing voltage Vers is about −10V. For example, the passing voltages Vpass are applied to the word lines WL1-WL6 and WL8-WL32. Accordingly, the memory cells 101-106 and 108-132 in the memory cell string 250_1 are turned on by the passing voltages Vpass, and the memory cells 201-206 and 208-232 in the memory cell string 250_2 are also turned on by the passing voltages Vpass.

In the present embodiment, multiple specific memory cell strings may also be set among the memory cell strings 250_1-250_M to erase memory cells in different specific memory cell strings and connected to the same word line all together, so as to improve the efficiency of the erasing operation.

Then, in step S330, a third voltage and a fourth voltage are respectively applied to a first source/drain region and a second source/drain region of the selected memory cell (memory cell 107), so that a band to band (BTB) hot hole injecting method is induced to erase the specific memory cell (memory cell 107), wherein the third voltage is not equal to the fourth voltage. And, in step S340, a fifth voltage and a sixth voltage are respectively applied to a first source/drain region and a second source/drain region of a non-selected memory cell (e.g., memory cell 207) connected the word line (e.g., 7$^{th}$ word line WL7 corresponding to the selected memory cell 107), so as to inhibit the non-selected memory cell 207 been erased. In other words, the non-selected cell 207 is not affected by the erasing method in the step S340.

Herein the step S330 and the step S340 in the first embodiment will be explained in detail. In detail procedure, each voltages of the specific memory cell string 250_1 and the inhibit memory cell strings (e.g., memory cell string 250_2) is applied, and then turn-on states of the select transistors and the ground transistors of each memory cell string are controlled, so as to implement the steps S330 and S340.

Figure 5:
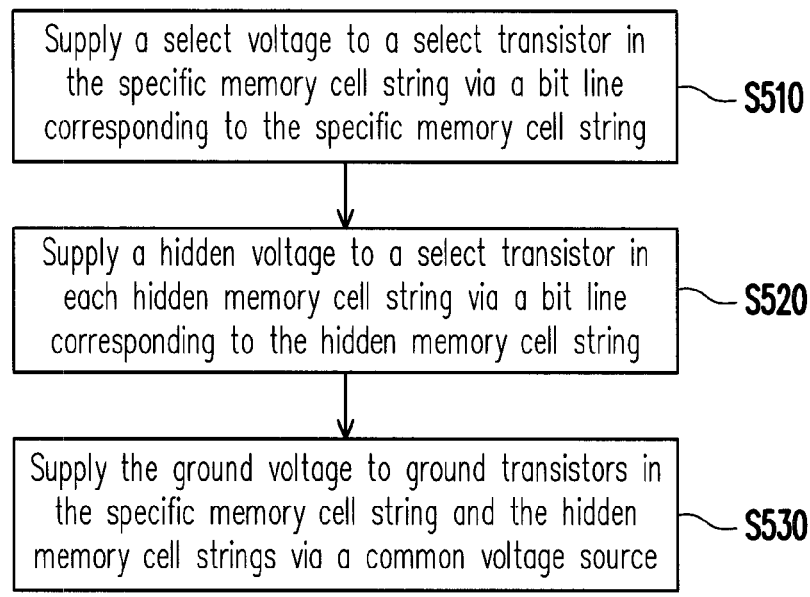
FIG. 5 is a flowchart for applying each voltages of the specific memory cell string and the inhibit memory cell strings.

The step for applying each voltages of the specific memory cell string 250_1 and the inhibit memory cell string 250_2 is illustrated in FIG. 5. FIG. 5 is a flowchart for applying each voltages of the specific memory cell string 250_1 and the inhibit memory cell string 250_2. In step S510, a select voltage (in the first embodiment, the select voltage is the third voltage, and the select voltage also is the ground voltage GND) is applied to the source of the select transistor SW11 in the specific memory cell string 250_1 via the bit line BL1 corresponding to the specific memory cell string 250_1.

In step S520, a hidden voltage (in the first embodiment, the hidden voltage is the supply voltage Vcc) is supplied to the source of the select transistor SW21 in the inhibit memory cell string 250_2 via the bit line BL2 corresponding to the inhibit memory cell string 250_2. The level of the supply voltage Vcc is determined by the fabrication process of the memory array 200, and in the present embodiment, the supply voltage Vcc may be 3.3V/1.8V. In step S530, the ground voltage GND is supplied to the sources of the ground transistors SW12 and SW22 in the specific memory cell string 250_1 and the inhibit memory cell string 250_2 via the common source CS.

Figure 6:
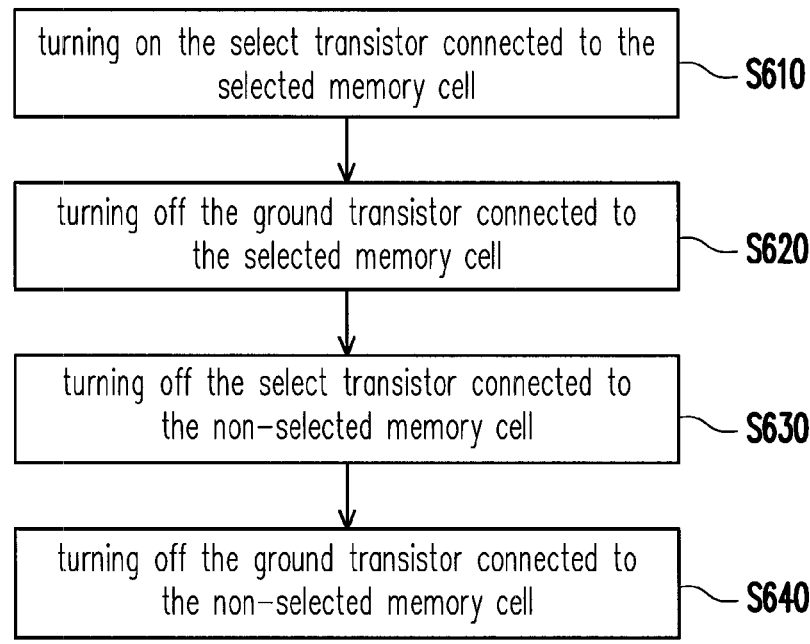
FIG. 6 is a flowchart for controlling the first transistors and the second transistors of each memory cell string.

As a result, proper voltages will be applied to the first source/drain region and the second source/drain region of the selected memory cell 107 and the non-selected memory cell 207 by controlling the select transistors and the ground transistors of each memory cell string. FIG. 6 is a flowchart for controlling the first transistors (select transistors) and the second transistors (ground transistors) of each memory cell string.

Referring to FIG. 6, in step S610, select transistor SW11 connected to the selected memory cell 107 is turned on, and in step S620, ground transistor SW12 connected to the selected memory cell 107 is turned off. In step S630, select transistor SW21 connected to the non-selected memory cell 207 is turned off, and in step S640, ground transistor SW22 connected to the non-selected memory cell 207 is turned off. In other words, in step S630 and S640, select transistor SW21 and ground transistor SW22 of inhibit memory cell string 250_2 connected to the non-selected memory cell 207 may turned off at the same time.

Herein the step procedure of FIG. 6 in the first embodiment is implemented via the string select line SSL and the ground select line GSL. The supply voltage Vcc is applied to the gate of the select transistor SW11 in the specific memory cell string 250_1 and the gate of the select transistor SW21 in the inhibit memory cell string 250_2 via the string select line SSL. Thus, the select transistor SW11 is turned on, and the select transistor SW21 is turned off because the gate and drain thereof are both applied to the supply voltage Vcc. In addition, the ground voltage GND is applied to the gate of the ground transistor SW12 in the specific memory cell string 250_1 and the gate of the ground transistor SW22 in the inhibit memory cell string 250_2 via the ground select line GSL. Thus, the ground transistors SW12 and SW22 are both turned off.

Herein the specific memory cell string 250_1 in the first embodiment will be explained based on foregoing descriptions. As shown in FIG. 4A, because the gate of the memory cell 107 receives the negative erasing voltage Vers, the memory cell 107 is in a turn-off state. In addition, because the select transistor SW11 and the memory cells 101-106 are all turned on, the channels of the select transistor SW11 and the memory cells 101-106 are connected with each other to form a channel 410. In addition, because the select transistor SW11 receives the ground voltage GND through the bit line BL1, the channel 410 is applied to the ground voltage GND through the directly voltage applying method, so as to apply the third voltage (ground voltage GND) to the first source/drain region of the selected memory cell 107. On the other point of view, as shown in FIG. 2, the channel 410 having the ground voltage GND in FIG. 4A is indicated with the dotted line 410.

On the other hand, because the memory cells 108-132 are all turned on, the channels of the memory cells 108-132 are connected with each other to form a channel 420. It should be mentioned that because two ends of the memory cells 108-132 are floated and the gates of the memory cells 108-132 receive the passing voltages Vpass, the voltage on the channel 420 is increased through self boosting of the memory cells 108-132. In other words, the channel 420 of the memory cells 108-132 connected to the second source/drain region of the selected memory cell 107 self boosts to the fourth voltage (for example, the drain boost voltage Vbd).

The voltage drop between the drain (the drain boost voltage Vbd) and the gate (the negative erasing voltage Vers) of the memory cell 107 produces a BTB tunneling effect and accordingly hot holes are generated. These hot holes can be injected from the drain of the memory cell 107 into the charge storage layer thereof and combine with electrons in the charge storage layer, so that the memory cell 107 is erased. Such an erasing technique is referred to as a hot hole injection erasing technique induced by BTB tunneling.

Herein the self boosting principle will be roughly explained by taking the memory cells 108-132 and the channel 420 as an example. When two ends (for example, the sources and drains) of the memory cells 108-132 are all floated and there is a voltage drop between the gates of the memory cells 108-132 and the substrate, two electrically and serially connected parasitic capacitors are formed between the gate of each of the memory cells 108-132 and the substrate. Thus, the passing voltage Vpass received by the gate of each of the memory cells 108-132 produces a division voltage in the channel 420 through the two serially connected parasitic capacitors, and accordingly, the voltage level in the channel 420 is increased.

Herein the inhibit memory cell string 250_2 in the first embodiment will be explained with reference to FIG. 4B again. Because the select transistor SW21 and the memory cell 207 are turned off, two ends of the memory cells 201-206 are all floated. In addition, because the memory cells 201-206 receive the passing voltages Vpass via the word lines WL1-WL6, a channel 430 having the fifth voltage (for example, the source boost voltage Vbs) is formed through self boosting. In other words, the channel 430 of the memory cells 201-206 connected to the first source/drain region of the non-selected memory cell 207 self boosts to the fifth voltage (source boost voltage Vbs).

Similarly, because the ground transistor SW22 and the memory cell 207 are turned off, two ends of the memory cells 208-232 are also floated. Accordingly, the memory cells 208-232 self boost through the passing voltages Vpass to form a channel 440 having the sixth voltage (for example, the drain boost voltage Vbd). In other words, the channel 440 of the memory cells 208-232 connected to the second source/drain region of the non-selected memory cell 207 self boosts to the sixth voltage (drain boost voltage Vbd). Thus, two ends of the memory cell 207 in the inhibit memory cell string 250_2 are respectively applied to the drain boost voltage Vbd and the source boost voltage Vbs. Because the drain boost voltage Vbd and the source boost voltage Vbs are both high level voltages, the production of hot holes is prevented in the memory cell 207, so that the memory cell 207 cannot be erased.

It should be mentioned that in the present embodiment, the passing voltages Vpass supplied to the word lines WL1-WL32 may have the same voltage level or different voltage levels. For example, in another embodiment, a source passing voltage Vpass_S (or referred to as a first passing voltage) is supplied to the memory cells 101-106 via the word lines WL1-WL6, and a drain passing voltage Vpass_D (or referred to as a second passing voltage) may be supplied to the memory cells 108-132 via the word lines WL8-WL32. Herein the source passing voltage Vpass_S is used for turning on the memory cells 101-106, and the drain passing voltage Vpass_D is used for keeping the voltage in the channels of the memory cells 108-132 at a certain level besides turning on the memory cells 108-132. Thus, the source passing voltage Vpass_S may be set to be lower than the drain passing voltage Vpass_D so as to reduce the power consumption of the memory array 200. In addition, the source passing voltage Vpass_S and the drain passing voltage Vpass_D can have the same voltage level.

While implementing the erasing method described above, as shown in FIG. 4A, regarding the memory cell 107, electrons generated due to the BTB hot hole tunnelling effect may cause the generation of more electron-hole pairs during the second impact. Besides, the electrons generated during the second impact may be attracted by the passing voltage Vpass of the memory cell 108 and injected into the floating gate of the memory cell 108, so that the threshold voltage of the memory cell 108 will be affected. Such a situation is referred to as erase disturb. In order to avoid erase disturb, in another embodiment, a low passing voltage Vpass_L is supplied to the word line WL8 corresponding to the memory cell 108 adjacent to the drain of the memory cell 107, so as to prevent the threshold voltage of the memory cell 108 from being changed. Herein the low passing voltage Vpass_L can be determined according to experimental data. In general, the low passing voltage Vpass_L should be lower than the drain passing voltage Vpass_D and higher than the drain boost voltage Vbd.

Second Embodiment

Figure 7:
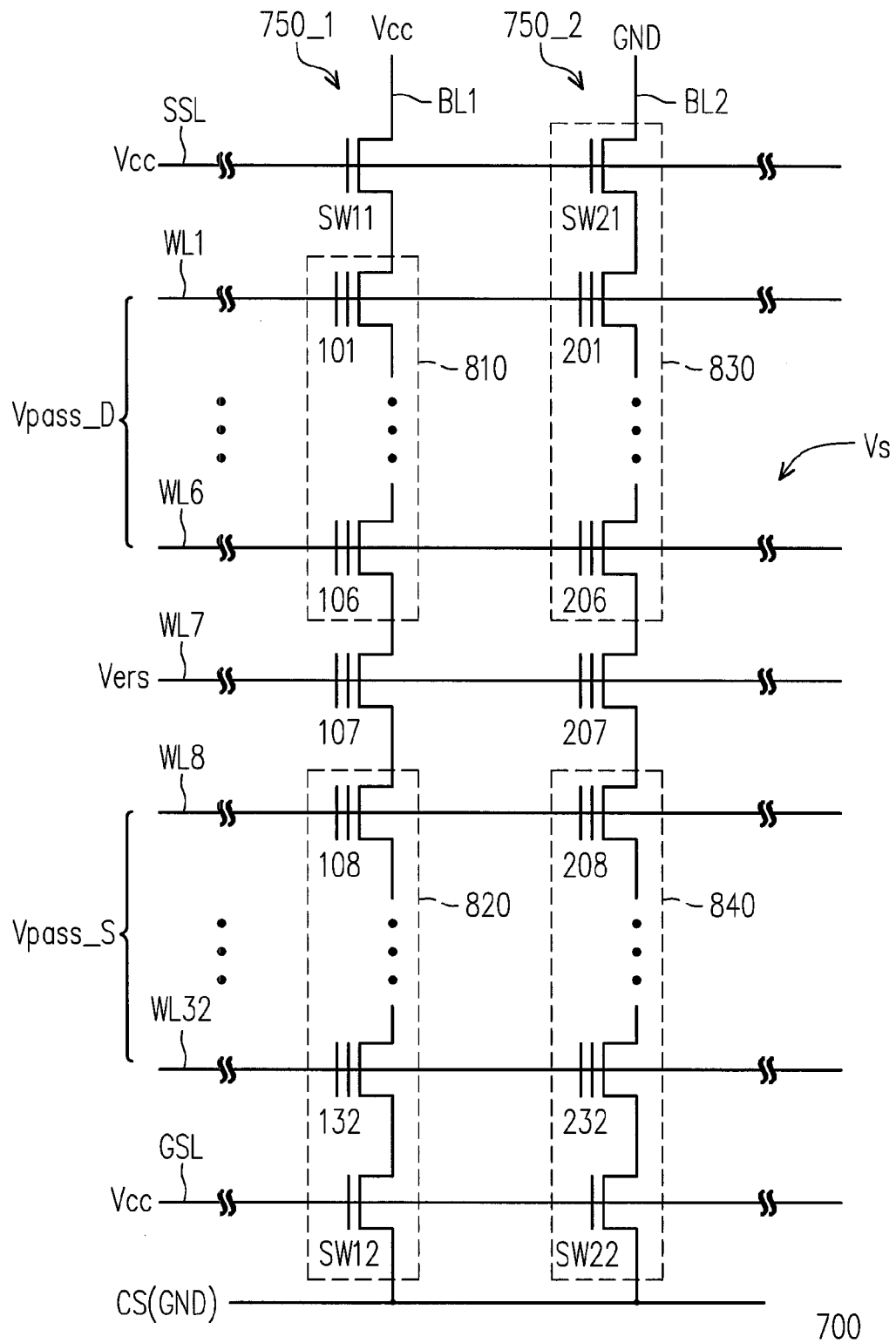
FIG. 7 is a diagram of a memory array according to a second embodiment of the invention.
Figure 8A:
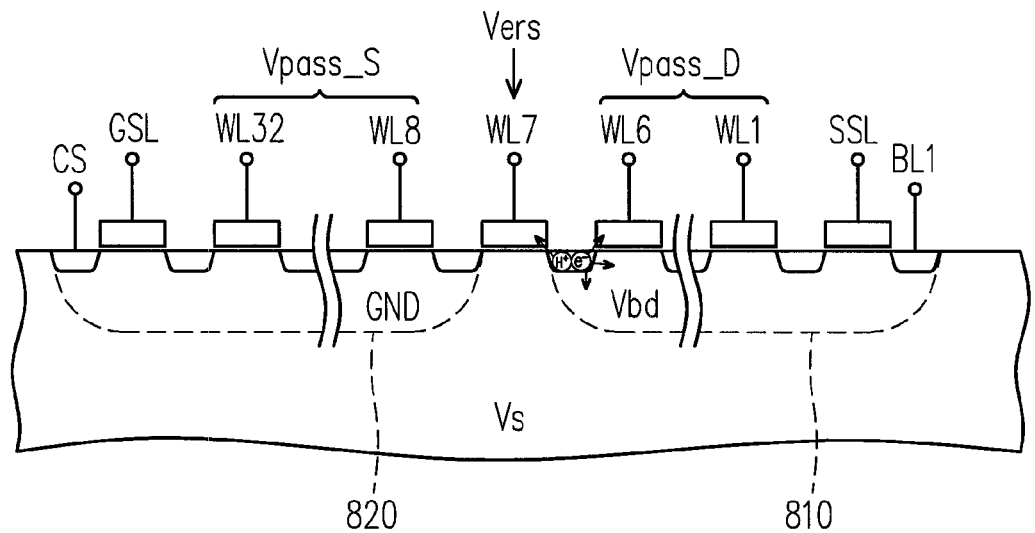
FIG. 8A is a cross-sectional view of a specific memory cell string in FIG. 7.
Figure 8B:
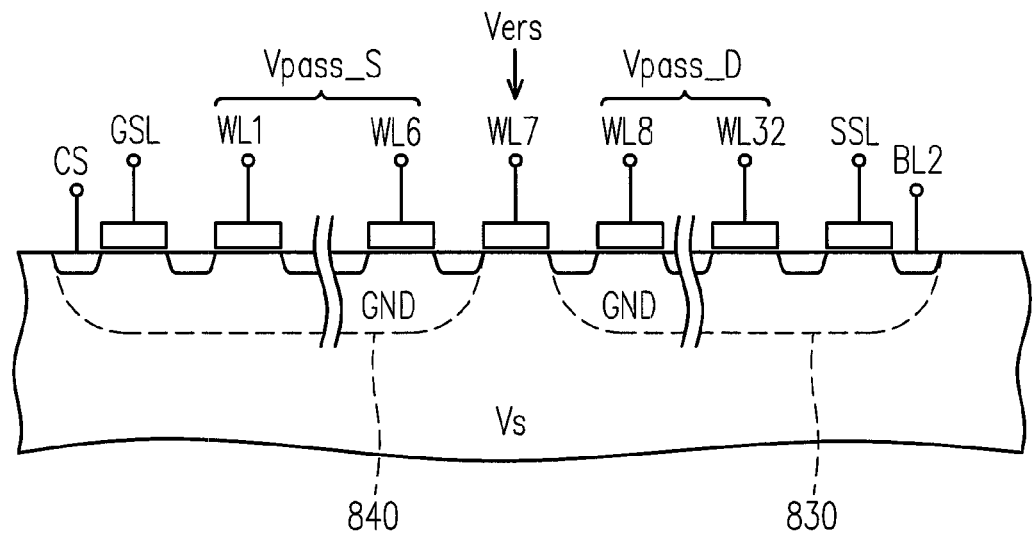
FIG. 8B is a cross-sectional view of a inhibit memory cell string in FIG. 7.

FIG. 7 is a diagram of a memory array 700 according to the second embodiment of the invention. FIG. 8A is a cross-sectional view of a specific memory cell string 750_1 in FIG. 7. FIG. 8B is a cross-sectional view of a inhibit memory cell string 750_2 in FIG. 7. Below, the erasing method illustrated in FIG. 3, FIG. 5, and FIG. 6 will be performed on the memory array 700 illustrated in FIG. 7, and the second embodiment will be described with reference to FIG. 8A and FIG. 8B.

The second embodiment is similar to the first embodiment, and the similar part won't be described herein. The main difference between the two embodiments is that in the second embodiment, the select voltage mentioned in step S510 (as shown in FIG. 5) is the supply voltage Vcc and the hidden voltage mentioned in step S520 is the ground voltage GND, which are obviously different from the select voltage and the hidden voltage in the first embodiment.

In the present embodiment, a memory cell string 750_1 is set as the specific memory cell string, and a memory cell string 750_2 is taken as an example of inhibit memory cell strings. Additionally, in step S320 (FIG. 3) of the second embodiment, the drain passing voltage Vpass_D is supplied to the word lines WL1-WL6 and the source passing voltage Vpass_S is supplied to the word lines WL8-WL32 to lower the operating voltage.

In addition, in step S610 (FIG. 6) of the second embodiment, select transistor SW11 connected to the selected memory cell 107 is turned off, and in step S620, ground transistor SW12 connected to the selected memory cell 107 is turned on. In other words, in the step S610 and S620, one of the select transistor SW11 and the ground transistor SW12 connected to the selected memory cell 107 is turned on. In addition, in step S630 and S640, select transistor SW21 and ground transistor SW22 connected to the non-selected memory cell 207 are both turned on at the same time.

Herein the step procedure of FIG. 6 in the second embodiment is implemented via the string select line SSL and the ground select line GSL. The supply voltage Vcc is applied to the select transistor SW11 in the specific memory cell string 750_1 via the string select line SSL, and the supply voltage Vcc is supplied to the select transistor SW12 in the specific memory cell string 750_1 via the ground select line GSL to replace the ground voltage GND in the first embodiment.

Herein the specific memory cell string 750_1 in the second embodiment will be explained based on foregoing descriptions. As shown in FIG. 8A, through the erasing method described in the present embodiment, the ground transistor SW11 and the memory cell 107 are turned off and two ends of the memory cells 101-106 are all floated. In addition, the memory cells 101-106 receive the drain passing voltage Vpass_D via the word lines WL1-WL6 so that a channel 810 having the third voltage (for example, drain boost voltage Vbd) is formed through self boosting of the memory cells 101-106, so as to apply the third voltage (drain boost voltage Vbd) to the first source/drain region of the selected memory cell 107. Moreover, because the ground transistor SW12 is turned on, a channel 820 having the fourth voltage (for example, ground voltage GND) is directly formed from the ground transistor SW12 to the memory cells 108-132 through the common source CS, so as to apply the fourth voltage (ground voltage GND) to the second source/drain region of the selected memory cell 107. Thus, two ends of the selected memory cell 107 in the specific memory cell string 750_1 are produced with a BTB tunnelling effect, so that the selected memory cell 107 is erased.

On the other hand, the inhibit memory cell string 750_2 in the embodiment will be explained herein. As shown in FIG. 8B, because the select transistor SW21 is turned on while the memory cell 207 is turned off through the erasing method described in the present embodiment, the select transistor SW21 and the memory cells 201-206 form a channel 830 having the sixth voltage (the ground voltage GND) through the directly voltage applying method, so as to apply the sixth voltage (ground voltage GND) to the second source/drain region of the non-selected memory cell 207. Thus, two ends of the memory cell 207 are both applied to the ground voltage GND and accordingly the memory cell 207 cannot be erased.

Additionally, while implementing the erasing method described above, in the second embodiment, the problem of erase disturb mentioned in the first embodiment will also be produced in the memory cell 106. Thus, a low passing voltage Vpass_L can be supplied to the word line WL6 to prevent any change in the threshold voltage of the memory cell 106.

Third Embodiment

Figure 9:
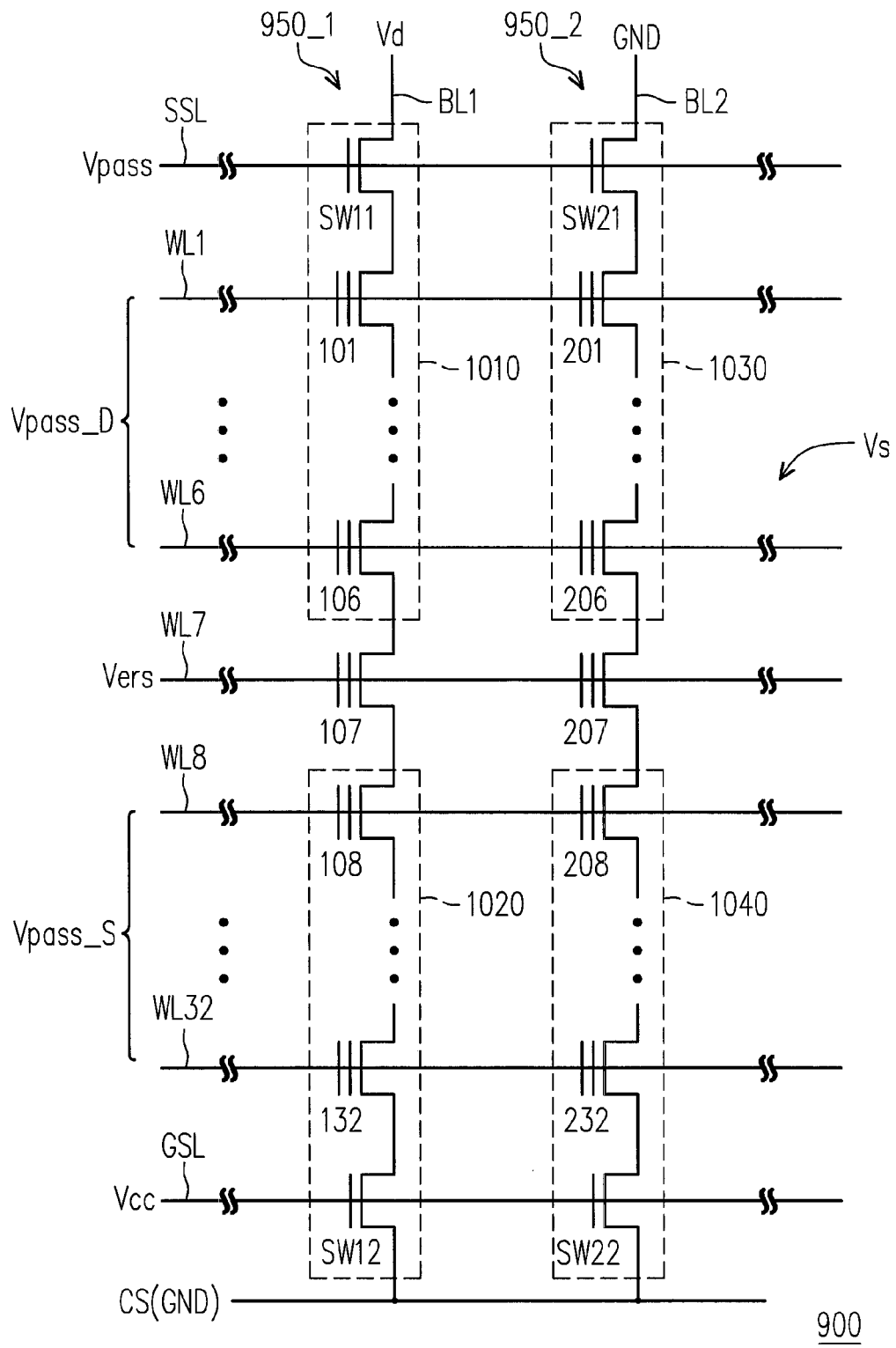
FIG. 9 is a diagram of a memory array according to the third embodiment of the invention.
Figure 10A:
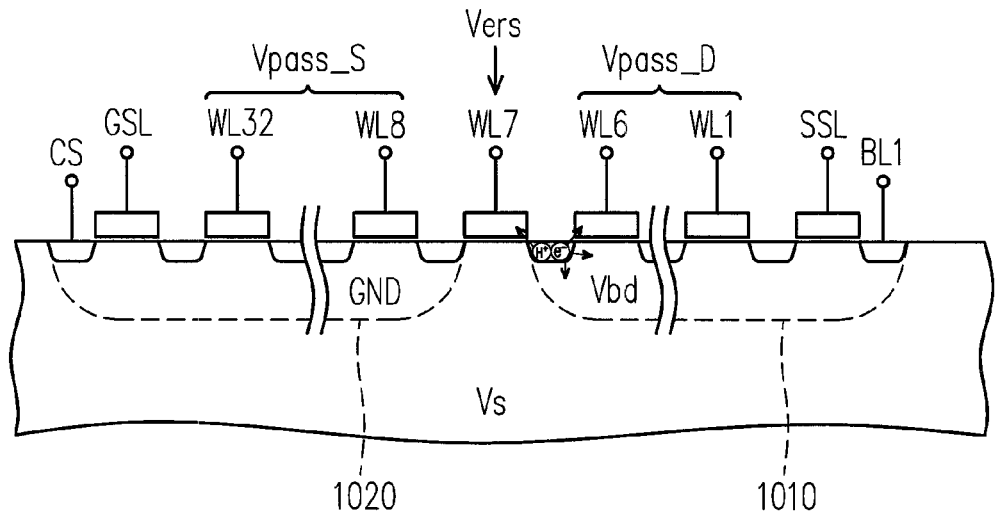
FIG. 10A is a cross-sectional view of a specific memory cell string in FIG. 9.
Figure 10B:
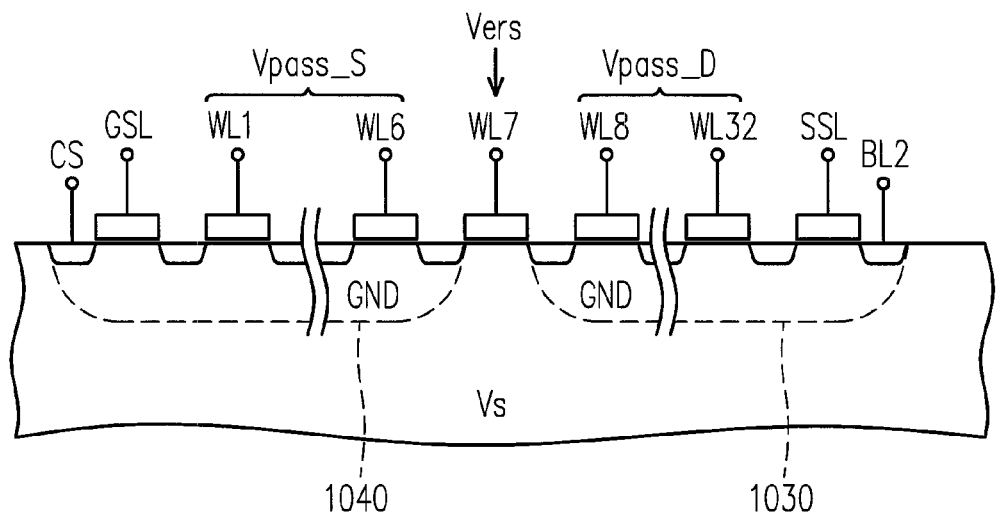
FIG. 10B is a cross-sectional view of a inhibit memory cell string in FIG. 9.

FIG. 9 is a diagram of a memory array 900 according to the third embodiment of the invention. FIG. 10A is a cross-sectional view of a specific memory cell string 950_1 in FIG. 9. FIG. 10B is a cross-sectional view of a inhibit memory cell string 950_2 in FIG. 9. Below, the erasing method illustrated in FIG. 3, FIG. 5, and FIG. 6 will be performed on the memory array 900 illustrated in FIG. 9, and the third embodiment will be described with reference to FIG. 10A and FIG. 10B.

The third embodiment is similar to the first and the second embodiment, and the similar part won't be described herein. The main difference between the third embodiment and the first and the second embodiments is that in step S510 (FIG. 5) of the third embodiment, the select voltage is the common voltage Vd higher than the supply voltage Vcc, so that a BTB tunnelling hot hole erasing operation can be induced in the memory cell 107 through the directly voltage applying method. In the present embodiment, the common voltage Vd may be 4.5V/4V.

In the present embodiment, a memory cell string 950_1 is set as the specific memory cell string, and a memory cell string 950_2 is taken as an example of inhibit memory cell strings. In step S530 (FIG. 5) of the third embodiment, the hidden voltage is the ground voltage GND. Besides, in step S610 (FIG. 6) of the third embodiment, select transistor SW11 connected to the selected memory cell 107 is turned on, and in step S620, ground transistor SW12 connected to the selected memory cell 107 is turned off. In addition, in step S630 and S640, select transistor SW21 and ground transistor SW22 of inhibit memory cell string 950_2 connected to the non-selected memory cell 207 may turned on at the same time.

Herein the step procedure of FIG. 6 in the third embodiment is implemented via the string select line SSL and the ground select line GSL. A passing voltage (for example, a passing voltage Vpass) is supplied to the select transistor SW11 in the specific memory cell string 950_1 via the string select line SSL. Accordingly, the select transistor SW11 is turned on by the passing voltage. The supply voltage Vcc is applied to the select transistor SW12 in the specific memory cell string 950_1 via the ground select line GSL in the third embodiment, which is similar to that in the second embodiment.

Herein the specific memory cell string 950_1 in the third embodiment will be explained. As shown in FIG. 10A, because the memory cell 107 is turned off and the select transistor SW11 and the ground transistor SW12 are turned on through the erasing method described in the present embodiment, the select transistor SW11 and the memory cells 101-106 receive the common voltage Vd through the bit line BL1. Accordingly, a channel 1010 having the common voltage Vd is directly formed, so as to apply the third voltage (the common voltage Vd) to the first source/drain region of the selected memory cell 107. The memory cells 108-132 and the ground transistor SW12 directly form a channel 1020 having the ground voltage GND through the common source CS, so as to apply the fourth voltage (the ground voltage GND) to the second source/drain region of the selected memory cell 107. Thus, because the common voltage Vd is also a high level voltage, a BTB tunnelling effect is produced at the memory cell 107 and accordingly the memory cell 107 is erased.

On the other hand, the inhibit memory cell string 950_2 in the third embodiment will be explained herein. As shown in FIG. 10B, because the memory cell 207 is turned off and the select transistor SW21 and the ground transistor SW22 are turned on through the erasing method described in the present embodiment, the select transistor SW21 and the memory cells 201-206 directly form a channel 1030 having the ground voltage GND through the ground voltage GND received by the bit line BL2, so as to apply the fifth voltage (ground voltage GND) to the first source/drain region of the non-selected memory cell 207. And, the memory cells 208-232 and the ground transistor SW22 directly form a channel 1040 having the ground voltage GND through the common source CS, so as to apply the sixth voltage (ground voltage GND) to the second source/drain region of the non-selected memory cell 207. Thus, the memory cell 207 cannot be erased.

Fourth Embodiment

Figure 11:
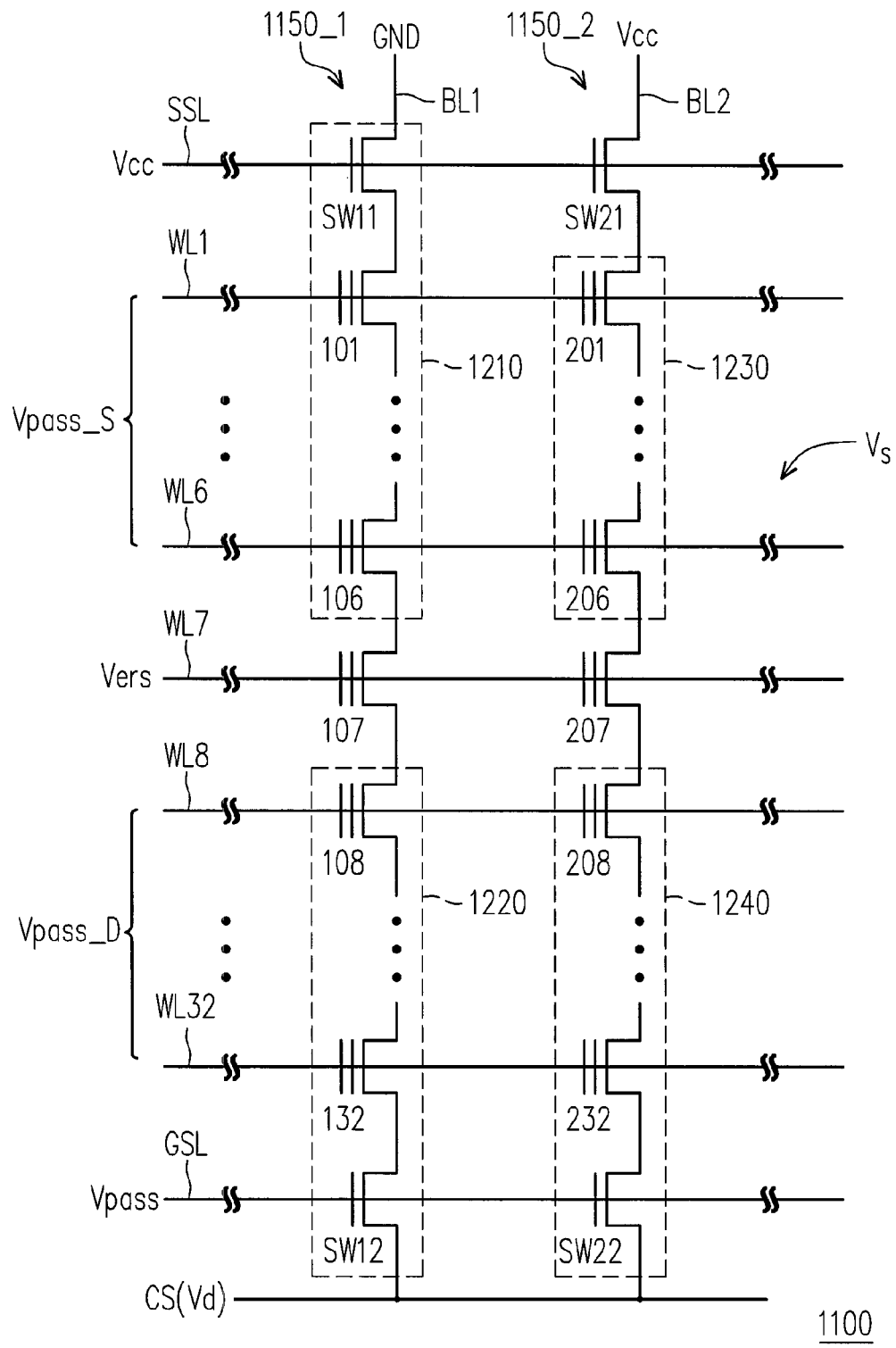
FIG. 11 is a diagram of a memory array according to the fourth embodiment of the invention.
Figure 12A:
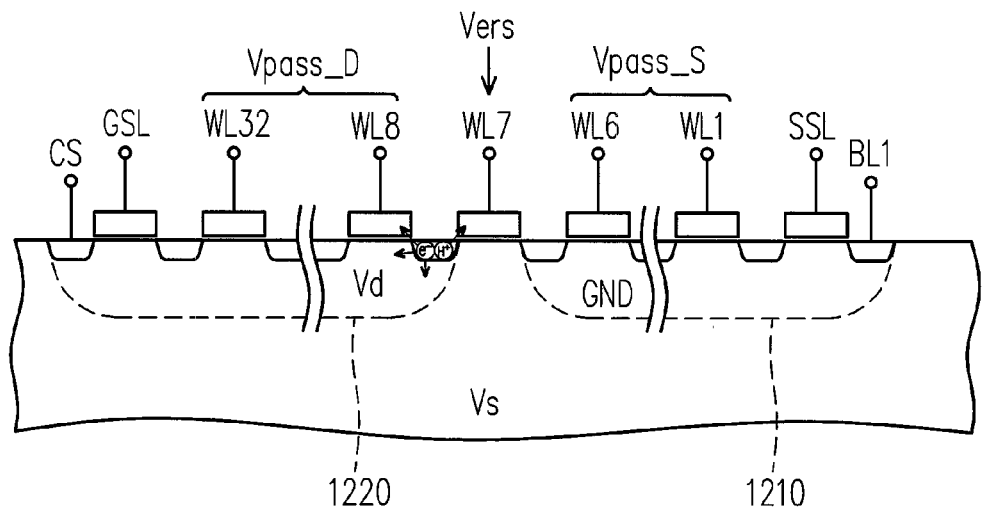
FIG. 12A is a cross-sectional view of a specific memory cell string in FIG. 11.
Figure 12B:
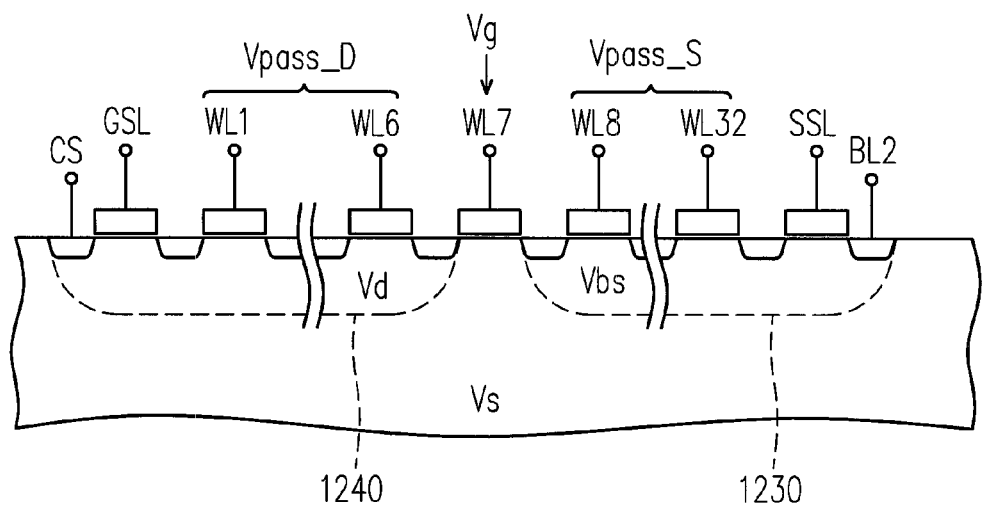
FIG. 12B is a cross-sectional view of a inhibit memory cell string in FIG. 11.

FIG. 11 is a diagram of a memory array 1100 according to the fourth embodiment of the invention. FIG. 12A is a cross-sectional view of a specific memory cell string 1150_1 in FIG. 11. FIG. 12B is a cross-sectional view of a inhibit memory cell string 1150_2 in FIG. 11. In the present embodiment, a memory cell string 1150_1 is set as the specific memory cell string, and a memory cell string 1150_2 is taken as an example of inhibit memory cell strings. Below, the erasing method illustrated in FIG. 3, FIG. 5, and FIG. 6 will be performed on the memory array 1100 illustrated in FIG. 11, and the fourth embodiment will be described with reference to FIG. 12A and FIG. 12B.

The fourth embodiment is similar to the embodiments described above, and the similar part will not be described herein. The main difference between the fourth embodiment and the embodiments described above is that in step S510 (FIG. 5) of the fourth embodiment, the select voltage is the ground voltage GND, and in step S510, the hidden voltage may be the supply voltage Vcc. Besides, in step S530 of the fourth embodiment, the common voltage Vd is supplied to the ground transistors SW12 and SW22 in the specific memory cell string 1150_1 and the inhibit memory cell string 1150_2 through the common source CS.

Thereby, in step S610 (FIG. 6) of the fourth embodiment, select transistor SW11 connected to the selected memory cell 107 is turned on, and in step S620, ground transistor SW12 connected to the selected memory cell 107 is also turned on. In addition, in step S630, select transistor SW21 of inhibit memory string 1150_2 connected to the non-selected memory cell 207 is turned off. And, in step S640, ground transistor SW22 connected to the non-selected memory cell 207 is turned on. In the fourth embodiment described above, the memory cell 207 is protected from the BTB tunnelling hot hole erasing operation through the self boosting and the directly voltage applying method.

Herein the step procedure of FIG. 6 in the fourth embodiment is implemented via the string select line SSL and the ground select line GSL In the fourth embodiment, the supply voltage Vcc is supplied to the select transistor SW11 in the specific memory cell string 1150_1 via the string select line SSL, and the passing voltage (for example, a passing voltage Vpass) is supplied to the select transistor SW12 in the specific memory cell string 1150_1 via the ground select line GSL.

Herein the specific memory cell string 1150_1 in the fourth embodiment will be explained. As shown in FIG. 12A, because the memory cell 107 is turned off and the select transistor SW11 and the ground transistor SW12 are turned on through the erasing method described in the present embodiment, the select transistor SW11 and the memory cells 101-106 form a channel 1010 having the ground voltage GND through the ground voltage GND received by the bit line BL1, so as to apply the third voltage (ground voltage GND) to the first source/drain region of the selected memory cell 107. The memory cells 108-132 and the ground transistor SW12 form a channel 1220 having the common voltage Vd through the common source CS, so as to apply the fourth voltage (common voltage Vd) to the second source/drain region of the selected memory cell 107. Thus, two ends of the memory cell 107 are respectively applied to the ground voltage GND and the common voltage Vd. In addition, because the common voltage Vd is also a high level voltage, the BTB tunnelling effect is produced at the memory cell 107 and accordingly the memory cell 107 is erased.

On the other hand, the inhibit memory cell string 1150_2 in the fourth embodiment will be explained herein. As shown in FIG. 12B, because the memory cell 207 and the select transistor SW21 are turned off and the ground transistor SW22 is turned on through the erasing method described in the present embodiment, the memory cells 201-206 self boost and accordingly form a channel 1230 having the source boost voltage Vbs, so as to apply the fifth voltage (the source boost voltage Vbs) to the first source/drain region of the non-selected memory cell 207. In addition, the memory cells 208-232 and the ground transistor SW22 form a channel 1240 having the common voltage Vd through the common source CS, so as to apply the sixth voltage (the common voltage Vd) to the second source/drain region of the non-selected memory cell 207. Since the common voltage Vd and the source boost voltage Vbs are both high level voltages, the memory cell 207 cannot be erased.

In order to describe embodiments of the invention more specifically, three driving waves of the memory array erasing method will be provided herein, and those skilled in the art can appropriately extend the erasing method to make it adaptable to foregoing four embodiments and other memory arrays applicable to the invention according to these three driving waves. Herein the first and the second driving waves will be explained by using the memory array 200 (as shown in FIG. 2) in the first embodiment, and the third driving wave will be explained by using the memory array 900 in the third embodiment.

Figure 13:
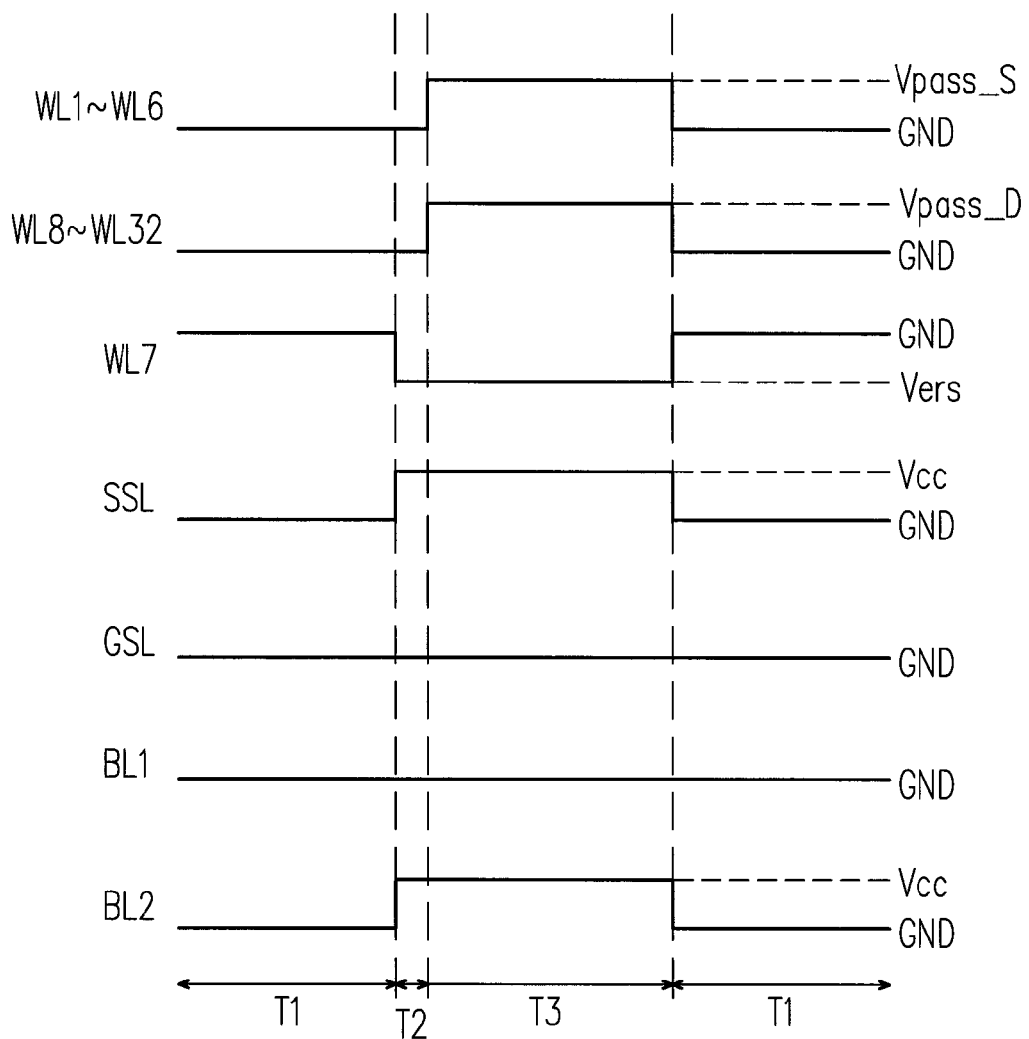
FIG. 13 illustrates a first driving waveform of a method for erasing a memory array according to the first embodiment of the invention.

FIG. 13 illustrates a first driving waveform of a method for erasing the memory array 200 according to the first embodiment of the invention, wherein different signal lines are indicated at the left of the waveform, and different voltages are indicated at the right of the waveform. Referring to both FIG. 2 and FIG. 13, similar to the first embodiment, herein it is assumed that the $7^{th}$ memory cell in the memory cell string 250_1 is to be erased (i.e., i=7).

During the period T1, all the word lines WL1-WL32, the string select line SSL, the ground select line GSL, and the bit lines BL1-BL2 are applied to the ground voltage GND. Then, during the pre-charging period T2, the negative erasing voltage Vers is first supplied to the selected word line WL7 so that the $7^{th}$ memory cell (for example, the memory cells 107 and 207) in each memory cell string is turned off. Accordingly, the memory cells (for example, the memory cells 101-106 and 201-206) above the $7^{th}$ memory cell and the memory cells (for example, the memory cells 108-132 and 208-232) below the $7^{th}$ memory cell are isolated from each other.

Thereby, during the pre-charging period T2, voltages on the string select line SSL, the ground select line GSL, and the bit lines BL1 and BL2 are supplied at the same time as or slightly later than the voltage supplied to the word line WL7 (for example, the supply voltage Vcc supplied to the string select line SSL and the bit line BL2). Next, during the erasing pulse period T3, the drain passing voltage Vpass_D and the source passing voltage Vpass_S are respectively supplied to the other word lines WL1-WL6 and WL8-WL32, so as to accomplish the erasing method described in the first embodiment. In the present embodiment, the source passing voltage Vpass_S and the drain passing voltage Vpass_D may also be replaced by using the common voltage Vd.

In the first driving waveform, the negative erasing voltage Vers is first supplied to the selected word line (for example, the word line WL7) to turn off the $7^{th}$ memory cell in each memory cell string, so as to prevent such problems as redelay and formation of channel. In addition, the negative erasing voltage Vers may also be supplied to an unselected word line to turn off the memory cell corresponding to the word line. By this way, aforementioned problems can also be prevented. In the second driving waveform, the $6^{th}$ memory cell adjacent to the selected $7^{th}$ memory cell may be first turned off, and the rest part of the implementation will be described below.

Figure 14:
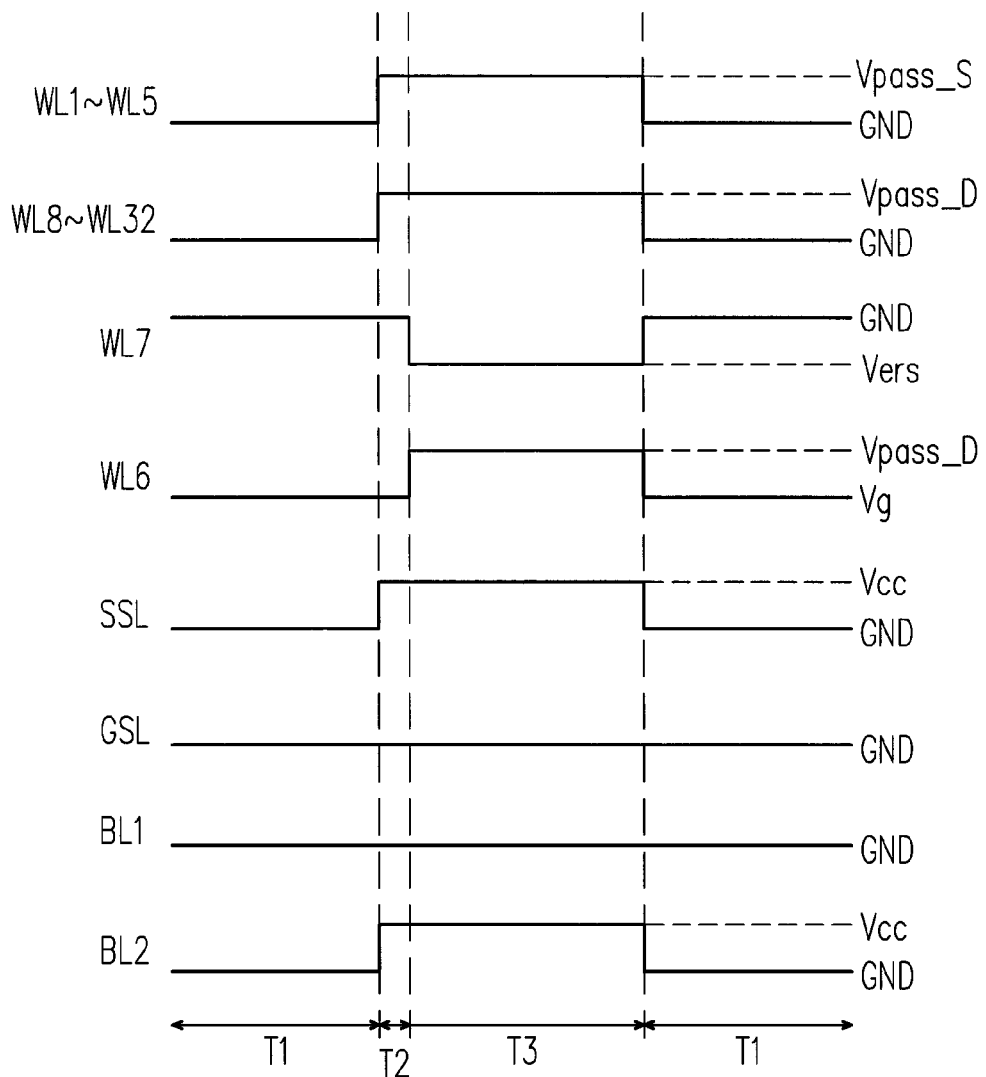
FIG. 14 illustrates a second driving waveform of a method for erasing a memory array according to the first embodiment of the invention.

FIG. 14 illustrates a second driving waveform of a method for erasing the memory array 200 according to the first embodiment of the invention. Referring to both FIG. 2 and FIG. 14, first, during the period T1, a negative voltage Vg is first supplied to the unselected word line WL6, and the other signal lines are applied to the ground voltage GND. Accordingly, the $6^{th}$ memory cells in all the memory cell strings are kept in the turn-off state. Thus, during the pre-charging period T2, corresponding voltages can be supplied to signals lines except the selected word lines WL7 and WL6.

Thereafter, during the erasing pulse period T3, the negative erasing voltage Vers is first supplied to the selected word line WL7 to turn off the $7^{th}$ memory cell (for example, the memory cells 107 and 207) in each memory cell string. Besides, the voltage on the word line WL6 (i.e., the drain passing voltage Vpass_D) may be supplied at the same time as or slight later than the voltage on the word line WL7. By this way, the erasing method described in the first embodiment can also be accomplished.

The third driving waveform is suitable to the third embodiment. In the third embodiment, the BTB hot hole tunnelling effect is produced through direct voltage applying in order to prevent any error in the timing of supplying voltages to the selected word line WL7 and bit lines BL1 and BL2, the select transistor SW11 and the memory cells 101-106 from forming the channel 1010 too quickly, and accordingly charges passing through the memory cell 207 which is not completely turned off.

Figure 15:
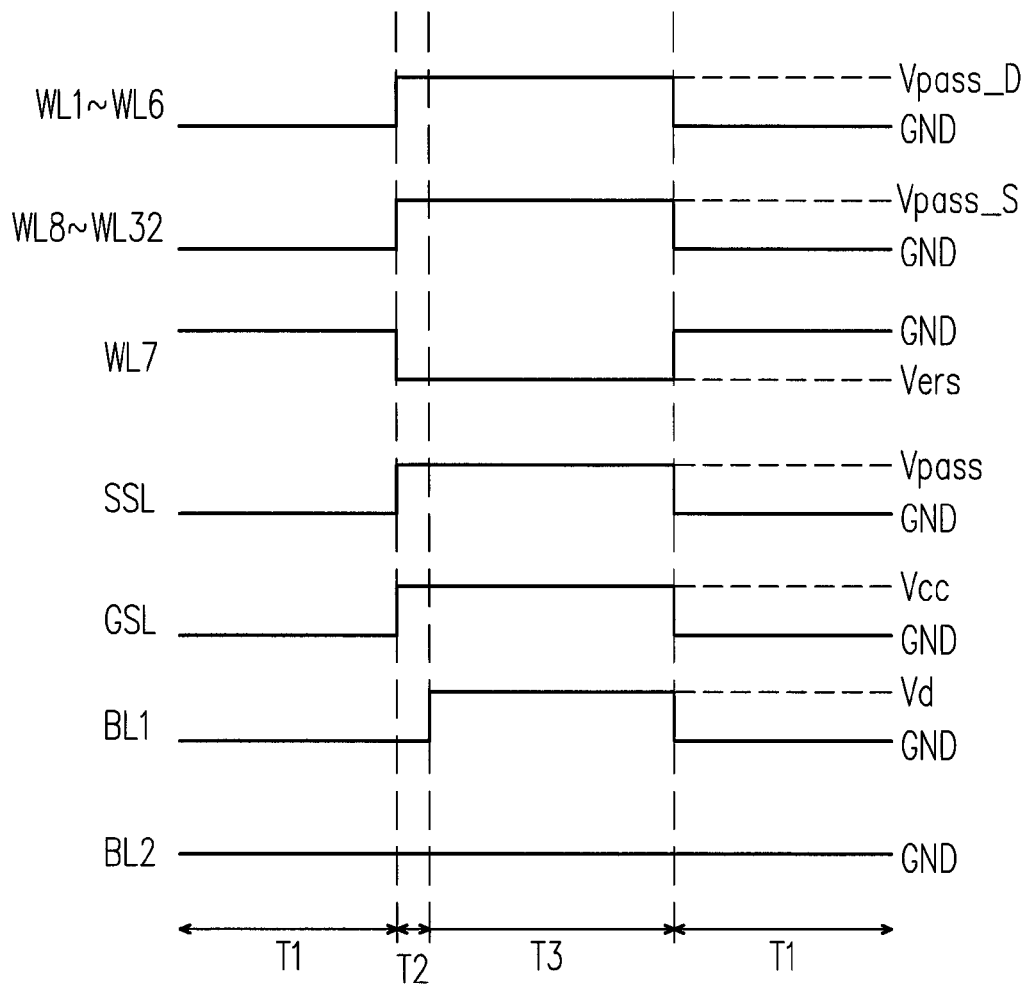
FIG. 15 illustrates a third driving waveform of a method for erasing a memory array according to a third embodiment of the invention.

FIG. 15 illustrates a third driving waveform of a method for erasing the memory array 900 according to the third embodiment of the invention. Referring to FIG. 9 and FIG. 15, during the period T1, all the signal lines are applied to the ground voltage GND. Then, during the pre-charging period T2, the negative erasing voltage Vers is first supplied to the selected word line WL7. Next, voltages on the word lines WL1-WL32, the string select line SSL, and the ground select line GSL are supplied at the same time as or slightly later than the voltage on the word line WL7. Thereafter, during the erasing pulse period T3, a voltage is supplied to the bit lines BL1 and BL2 (for example, the common voltage Vd is supplied to the bit line BL1) to prevent any error in the timing of supplying voltages to the selected word line WL7 and the bit lines BL1 and BL2.

As described above, in the invention, a BTB hot hole erasing operation is induced on a specific memory cell through the self boosting or directly voltage applying of memory cells, so that the specific memory cell in a specific memory cell string can be erased without affecting the other memory cells. In addition, because the voltage drop required by the BTB hot hole erasing operation is lower than the vertical electric field required by the FN tunnelling technique, the operating voltage required by the erasing operation is greatly lowered.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A method for erasing a memory array, wherein the memory array comprises a plurality of memory cell strings, each of the memory cell strings comprises a plurality of memory cells connected to a plurality of word lines, wherein each of the memory cell strings further comprises a first transistor and a second transistor, the method for erasing the memory array comprising:
    applying a first voltage to a substrate of the memory array;
    applying a second voltage to a word line of a selected memory cell, and applying a plurality of passing voltages to the other word lines;
    respectively applying a third voltage and a fourth voltage to a first source/drain region and a second source/drain region of the selected memory cell, so that a band to band (BTB) hot hole injecting method is induced to erase the specific memory cell, wherein the third voltage is not equal to the fourth voltage;
    turning on the first transistor connected to the selected memory cell, so as to apply the third voltage to the first source/drain region of the selected memory cell; and
    turning off the second transistor connected to the selected memory cell, so that a channel of the memory cells connected to the second source/drain region of the selected memory cell self boosts to the fourth voltage.

2. The memory array erasing method according to claim 1, wherein each of the memory cell strings further comprises a first transistor and a second transistor, and the memory array erasing method further comprises:
    turning on one of the first transistor and the second transistor connected to the selected memory cell, or turning on the first transistor and the second transistor connected to the selected memory cell at the same time.

3. The memory array erasing method according to claim 1, wherein each of the memory cell strings further comprises a first transistor and a second transistor, and the memory array erasing method further comprises:
    turning on the first transistor connected to the selected memory cell, so as to apply the third voltage to the first source/drain region of the selected memory cell; and
    turning on the second transistor connected to the selected memory cell, so as to apply the fourth voltage to the second source/drain region of the selected memory cell.

4. The memory array erasing method according to claim 3, wherein the third voltage is a first power supply voltage, and the fourth voltage is a second power supply voltage.

5. The memory array erasing method according to claim 3, wherein the third voltage is a ground voltage.

6. The memory array erasing method according to claim 1, further comprising:
respectively applying a fifth voltage and a sixth voltage to a first source/drain region and a second source/drain region of a non-selected memory cell connected to the word line of the selected memory cell, so as to inhibit the non-selected memory cell been erased.

7. The memory array erasing method according to claim 6, wherein each of the memory cell strings further comprises a first transistor and a second transistor, and the memory array erasing method further comprises:
turning off the first transistor and the second transistor of the memory cell string connected to the non-selected memory cell at the same time, so that a channel of the memory cells connected to the first source/drain region of the selected memory cell self boosts to the fifth voltage, and a channel of the memory cells connected to the second source/drain region of the selected memory cell self boosts to the sixth voltage.

8. The memory array erasing method according to claim 6, wherein each of the memory cell strings further comprises a first transistor and a second transistor, and the memory array erasing method further comprises:
turning on the first transistor and the second transistor of the memory cell string connected to the non-selected memory cell at the same time, so as to apply the fifth voltage and the sixth voltage to the first source/drain region and the second source/drain region of the non-selected memory cell respectively.

9. The memory array erasing method according to claim 8, wherein the fifth voltage is equal to the sixth voltage.

10. The memory array erasing method according to claim 8, wherein the fifth voltage and the sixth voltage are equal to a ground voltage or a common voltage.

11. The memory array erasing method according to claim 8, wherein each of the memory cell strings further comprises a first transistor and a second transistor, and the memory array erasing method further comprises:
turning off the first transistor of the memory cell string connected to the non-selected memory cell, so that a channel of the memory cells connected to the first source/drain region of the non-selected memory cell self boosts to the fifth voltage; and
turning on the second transistor of the memory cell string connected to the non-selected memory cell, so as to apply the sixth voltage to the second source/drain region of the non-selected memory cell.

12. The memory array erasing method according to claim 1, wherein the first voltage is a ground voltage.

13. The memory array erasing method according to claim 1, wherein the second voltage is smaller than 0.

14. The memory array erasing method according to claim 1, wherein the difference between the first voltage and the second voltage is larger than or equal to 10V.

15. The memory array erasing method according to claim 1, wherein the difference between the first voltage and the second voltage is smaller than 20V.

16. A method for erasing a flash memory array, wherein the flash memory array comprises a plurality of memory cell strings, each of the memory cell strings comprises N memory cells connected to N word lines, and N is a positive integer, the method for erasing the flash memory array comprising:
applying a ground voltage to a substrate of the memory array;
applying a negative erasing voltage to the ith word line, and supplying a plurality of passing voltages to the other word lines, wherein i is a positive integer not greater than N;
setting one of the memory cell strings as a specific memory cell string, and setting the other memory cell strings as a plurality of inhibit memory cell strings; and
respectively applying a high level voltage and the ground voltage to two ends of the ith memory cell in the specific memory cell string to, and applying the ground voltage or the high level voltage to both ends of the ith memory cell in each of the inhibit memory cell strings, so as to erase the ith memory cell in the specific memory cell string and inhibit the ith memory cells in the inhibit memory cell strings been erased.

17. The flash memory array erasing method according to claim 16, wherein each of the memory cell strings further comprises a select transistor and a ground transistor, and the step of setting one of the memory cell strings as the specific memory cell string and the other memory cell strings as the inhibit memory cell strings comprises:
applying the ground voltage to the select transistor in the specific memory cell string;
applying a supply voltage to the select transistors in the inhibit memory cell strings; and
applying the ground voltage to the ground transistors in the specific memory cell string and the inhibit memory cell strings.

18. The flash memory array erasing method according to claim 17, wherein the high level voltage comprises a first boost voltage and a second boost voltage, and the step of respectively biasing two ends of the ith memory cell in the specific memory cell string to the high level voltage and the ground voltage and biasing both ends of the ith memory cell in each of the inhibit memory cell strings to the high level voltage comprises:
applying the supply voltage to a gate of the select transistor in the specific memory cell string via a string select line; and
applying the ground voltage to a gate of the ground transistor in the specific memory cell string via a ground select line,
wherein the ground voltage and the second boost voltage are respectively applied to the two ends of the ith memory cell in the specific memory cell string, and the first boost voltage and the second boost voltage are respectively applied to the two ends of the ith memory cell in each of the inhibit memory cell strings.

19. The flash memory array erasing method according to claim 16, wherein the step of applying the negative erasing voltage to the ith word line and supplying the passing voltages to the other word lines comprises:
applying a first passing voltage among the passing voltages to the 1st-(i−1)th word lines, so that the 1st-(i−1)th memory cells in the specific memory cell string form a channel having the ground voltage, and the 1st-(i−1)th memory cells in the inhibit memory cell strings self boost to form a channel having a first boost voltage; and
applying a second passing voltage among the passing voltages to the (i+1)th-Nth word lines, so that the (i+1)th-Nth memory cells in the specific memory cell string and the inhibit memory cell strings self boost to form a channel having a second boost voltage.

* * * * *